(12) United States Patent
Mangon et al.

(10) Patent No.: US 7,761,266 B2
(45) Date of Patent: Jul. 20, 2010

(54) SYNCHRONIZED PHYSICAL AND ANALYTICAL REPRESENTATIONS OF A CAD MODEL

(75) Inventors: Nicolas Mangon, Waltham, MA (US); Lev Lipkin, Weston, MA (US)

(73) Assignee: Autodesk, Inc., San Rafael, CA (US)

( * ) Notice: Subject to any disclaimer, the term of this patent is extended or adjusted under 35 U.S.C. 154(b) by 1030 days.

(21) Appl. No.: 11/340,082

(22) Filed: Jan. 25, 2006

(65) Prior Publication Data

US 2007/0174026 A1 Jul. 26, 2007

(51) Int. Cl.
G06F 17/50 (2006.01)
(52) U.S. Cl. .......................... 703/2; 345/419; 345/420; 345/661; 345/681; 703/1
(58) Field of Classification Search .................. 703/2, 703/14, 1; 702/183; 716/6; 345/419, 420, 345/661, 681; 700/182; 715/964
See application file for complete search history.

(56) References Cited

U.S. PATENT DOCUMENTS

| | | | |
|---|---|---|---|
| 5,268,998 A | 12/1993 | Simpson | |
| 5,557,537 A | 9/1996 | Normann et al. | |
| 5,856,828 A | 1/1999 | Letcher, Jr. | |
| 5,923,573 A | 7/1999 | Hatanaka | |
| 6,052,691 A | 4/2000 | Ardoin et al. | |
| 6,426,745 B1 | 7/2002 | Isaacs et al. | |
| 6,629,065 B1 | 9/2003 | Gadh et al. | |
| 6,799,463 B2 | 10/2004 | Fields et al. | |
| 6,816,819 B1 | 11/2004 | Loveland | |
| 6,859,768 B1 | 2/2005 | Wakelam et al. | |
| 7,162,706 B2* | 1/2007 | Kuang et al. | 716/6 |
| 7,246,044 B2 | 7/2007 | Imamura et al. | |
| 7,292,908 B2 | 11/2007 | Borne et al. | |
| 2001/0033281 A1 | 10/2001 | Yoshida et al. | |
| 2003/0139907 A1* | 7/2003 | McCarthy | 702/183 |
| 2003/0200062 A1 | 10/2003 | Dessureault et al. | |
| 2004/0153824 A1 | 8/2004 | Devarajan et al. | |
| 2005/0038636 A1 | 2/2005 | Wakelam et al. | |
| 2005/0131924 A1 | 6/2005 | Jones | |
| 2005/0209831 A1 | 9/2005 | Jungreis et al. | |
| 2006/0119601 A1* | 6/2006 | Finlayson et al. | 345/427 |

(Continued)

FOREIGN PATENT DOCUMENTS

EP 1223520 7/2002

(Continued)

OTHER PUBLICATIONS

International Search Report for PCT Application No. PCT/US08/58746, dated Aug. 15, 2008.

(Continued)

*Primary Examiner*—Thai Phan
(74) *Attorney, Agent, or Firm*—Fish & Richardson P.C.

(57) ABSTRACT

Methods and apparatus, including computer program products, for providing a computer aided design (CAD) model comprising a plurality of physical elements. An analytical representation of the plurality of physical elements is generated. The analytical representation comprising a plurality of analytical elements corresponding to the physical elements. An association between each analytical element and corresponding physical element is generated such that a modification to one element can be applied to modify a corresponding other.

20 Claims, 14 Drawing Sheets

U.S. PATENT DOCUMENTS

| | | |
|---|---|---|
| 2006/0143220 A1 | 6/2006 | Spencer, Jr. |
| 2006/0208169 A1 | 9/2006 | Breed et al. |
| 2006/0230351 A1 | 10/2006 | Stehle et al. |
| 2007/0063378 A1 | 3/2007 | O'Donoghue |
| 2007/0091119 A1 | 4/2007 | Jezyk et al. |
| 2007/0174027 A1 | 7/2007 | Moiseyev |
| 2007/0179759 A1 | 8/2007 | Mangon |
| 2007/0179976 A1 | 8/2007 | Arvin et al. |
| 2007/0219764 A1 | 9/2007 | Backe |
| 2007/0282792 A1 | 12/2007 | Bailly et al. |
| 2008/0077364 A1 | 3/2008 | Wakelam et al. |

FOREIGN PATENT DOCUMENTS

| | | |
|---|---|---|
| WO | WO 02/08975 | 1/2002 |
| WO | WO 03/100555 | 12/2003 |

OTHER PUBLICATIONS

Autodesk, Inc., International Search Report and the Written Opinion of the International Searching Authority dated Aug. 31, 2007 for International Patent Application No. PCT/US2007/064009 filed Mar. 14, 2007.

ESS: "Klima2000 Handbuch—Schritt für Schritt (Excerpt: Kapitel 10)", KLIMA 2000, 1999, pp. 10-1 to 10-45.

U.S. Appl. No. 11/619,565, filed Jan. 3, 2007, Kfouri et al.

U.S. Appl. No. 11/460,524, filed Jul. 27, 2006, Kfouri et al.

U.S. Appl. No. 11/695,535, filed Apr. 2, 2007, Culver et al.

Parametric Technology Corporation, "Getting Started with Pro/Engineer(R) 2001," 2001, Parametric Technology Corporation, pp. 1-192.

Autodesk Inc., "AutoCAD Architectural Desktop (tm) User's Guide," 1999, Autodesk Inc., Release 2, pp. 1-xxiv; 1-8; 219-296.

Ramon F. Sarraga, "Modifying CAD/CAM surfaces according to displacements prescribed at a finite set of points," Computer-Aided Design vol. 36, Issue 4, Feb. 2004, pp. 343-349.

H.N. Gürsoy, "Tetrahedral Finite Elemente Mesh Generation from NURBS Solid Models," Engineering with Computers (1996), (12), pp. 211-223.

European Patent Office Examination Report for EP Application No. 07 758 552.9—2224, dated Sep. 17, 2009, 8 pages.

International Preliminary Report on Patentability for PCT Application No. PCT/US08/58746, dated Oct. 6, 2009, 6 pages.

Non-Final Office Action dated Oct. 17, 2008 for U.S. Appl. No. 11/341,228, 22 pages.

Final Office Action dated Jun. 1, 2009 for U.S. Appl. No. 11/341,228, 17 pages.

Non-Final Office Action dated Dec. 2, 2009 for U.S. Appl. No. 11/341,228, 28 pages.

Non-Final Office Action dated Oct. 6, 2008 for U.S. Appl. No. 11/345,436, 12 pages.

Final Office Action dated May 15, 2009 for U.S. Appl. No. 11/345,436, 12 pages.

Non-Final Office Action dated Sep. 18, 2009 for U.S. Appl. No. 11/614,049, 16 pages.

Non-Final Office Action dated Feb. 17, 2009 for U.S. Appl. No. 11/619,565, 16 pages.

Final Office Action dated Sep. 8, 2009 for U.S. Appl. No. 11/619,565, 15 pages.

Non-Final Office Action dated Dec. 24, 2009 for U.S. Appl. No. 11/619,565, 16 pages.

Non-Final Office Action dated Jan. 28, 2010 for U.S. Appl. No. 11/614,049, 10 pages.

* cited by examiner (a)

(b)

SYNCHRONIZED PHYSICAL AND ANALYTICAL REPRESENTATIONS OF A CAD MODEL

BACKGROUND

Computer aided design (CAD) software is often used to prepare a CAD model or models representing a structure, such as a building, while in the design stages. The CAD model can include representations of physical elements, such as columns, beams, and the like that will be included in the structure, and drawings prepared from such a CAD model can be used in the actual physical construction of the corresponding structure. The CAD model may be prepared and edited by various individuals, including architects and structural engineers. As part of the design stage, a structural analysis is typically performed on components that will be included in the structure, for example, to ensure there is sufficient load bearing capacity and the like. Structural analysis software is available to facilitate the analysis process. Conventional structural analysis software receives as input an analytical representation of a structure. An analytical representation of a structure is different than a representation of the physical elements, e.g., columns, beams, etc. It is an idealized mathematical model that may represent only a portion of a building such as one wing or one floor or one frame of the building. For example, an analytical representation may be a wire frame representation of the physical elements, and the wire frame elements can include or be associated with properties (e.g., weight, moment of inertia, cross-sectional area), member connectivity and/or end conditions (e.g., pinned, free, fixed). Typically, the analytical representation is prepared separately and is used for the structural analysis and perhaps other types of analyses that are performed in the design stage.

The analytical representation can be subjected to load simulation and the like in a structural analysis program, for example, to identify stress levels in the various elements. On the basis of the analysis, elements may be modified (e.g., resized or other properties changed) and the modified analytical representation reanalyzed. The results of the analysis can be used to manually update the corresponding physical elements in the CAD model. The effort and coordination involved with maintaining two separate representations of the CAD model (i.e., the physical and the analytical) and maintaining synchronicity between the two can be significant. Synchronization problems not caught before a design is finalized can result in unexpected costs and scheduling problems and safety as the structure may collapse.

SUMMARY

This specification describes systems, techniques and computer programs for synchronizing physical and analytical representations of a CAD model.

In one general aspect, the techniques feature providing a computer aided design (CAD) model comprising a plurality of physical elements. Generating an analytical representation of the plurality of physical elements, the analytical representation comprising a plurality of analytical elements corresponding to the physical elements. And generating an association between each analytical element and corresponding physical element such that a modification to one element can be applied to modify a corresponding other.

The invention can be implemented to include one or more of the following advantageous features. Performing a structural analysis of the CAD model based on the analytical representation. Modifying the analytical representation based on the structural analysis. Modifying one or more of the plurality of physical elements based on the modification to the analytical representation. Providing a CAD model comprises receiving user input creating the CAD model. Providing a CAD model comprises importing an existing CAD model. Receiving a user input modifying a physical element, modifying the physical element in accordance with the user input, and modifying a corresponding analytical element based on the modification to the physical element. Receiving a user input modifying an analytical element, modifying the analytical element in accordance with the user input, and modifying a corresponding physical element based on the modification to the analytical element. A physical element has an associated a physical appearance. An analytical element is a point-to-point wire frame representation of a corresponding physical element. One or more of the analytical elements include a variation from the corresponding one or more physical elements, where the variation facilitates a structural analysis of the analytical representation.

In another general aspect, the techniques feature receiving a user input to modify one of a physical element or an analytical element corresponding to the physical element. If the physical element is modified, automatically modifying the analytical element to reflect the modification to the physical element. If the analytical element is modified, automatically modifying the physical element to reflect the modification to the analytical element. And where the physical element is included in a physical representation of a CAD model and the analytical element is included in an analytical representation of the CAD model.

The invention can be implemented to include one or more of the following advantageous features. Performing a structural analysis of the CAD model based on the analytical representation. Modifying the analytical representation based on the structural analysis. Modifying the CAD model based on the structural analysis.

In another general aspect, the techniques feature performing a structural analysis of an analytical representation of a computer aided design (CAD) model. Automatically modifying the analytical representation of the CAD model based on the structural analysis. And modifying the CAD model in accordance with the modification to the analytical representation of the CAD model.

The invention can be implemented to include one or more of the following advantageous features. Modifying the CAD model includes resizing one or more physical elements in the CAD model. Modifying the CAD model includes updating one or more attributes associated with a physical element in the CAD model with information generated by the structural analysis. Presenting the analytical representation as a point-to-point wire frame representation of the CAD model.

Implementations of the invention can realize one or more of the following advantages. A physical representation and a corresponding analytical representation can be integrated in a single Computer Aided Design (CAD) model. Modifications made to elements in the physical representation can be automatically reflected in the analytical representation, and vice versa. The analytical representation of a CAD model can be automatically created, and can be modified by a user. This saves users time and allows users to work on more projects. A structural analysis of the analytical representation can be used to optimize the physical design and effect synchronized changes to the analytical and physical representations. Results from structural analysis can be automatically included in physical drawings, which can result in better and safer designs. Various structural analysis programs can be used, and other types of analysis can be performed, including concrete design analysis, lateral load analysis, gravity load analysis, beam design analysis, steel design analysis, dynamic analysis, seismic analysis and steel connection design analysis.

The details of one or more implementations of the invention are set forth in the accompanying drawings and the description below. Other features, aspects, and advantages of the invention will be apparent from the description and drawings, and from the claims.

DESCRIPTION OF DRAWINGS

FIG. 6 shows a user interface displaying a plan view combining physical and analytical representations and illustrating a divergence there between.

Like reference symbols in the various drawings indicate like elements.

DETAILED DESCRIPTION

System, techniques and computer programs for synchronizing physical and analytical representations of a CAD model are described.

Figure 1:
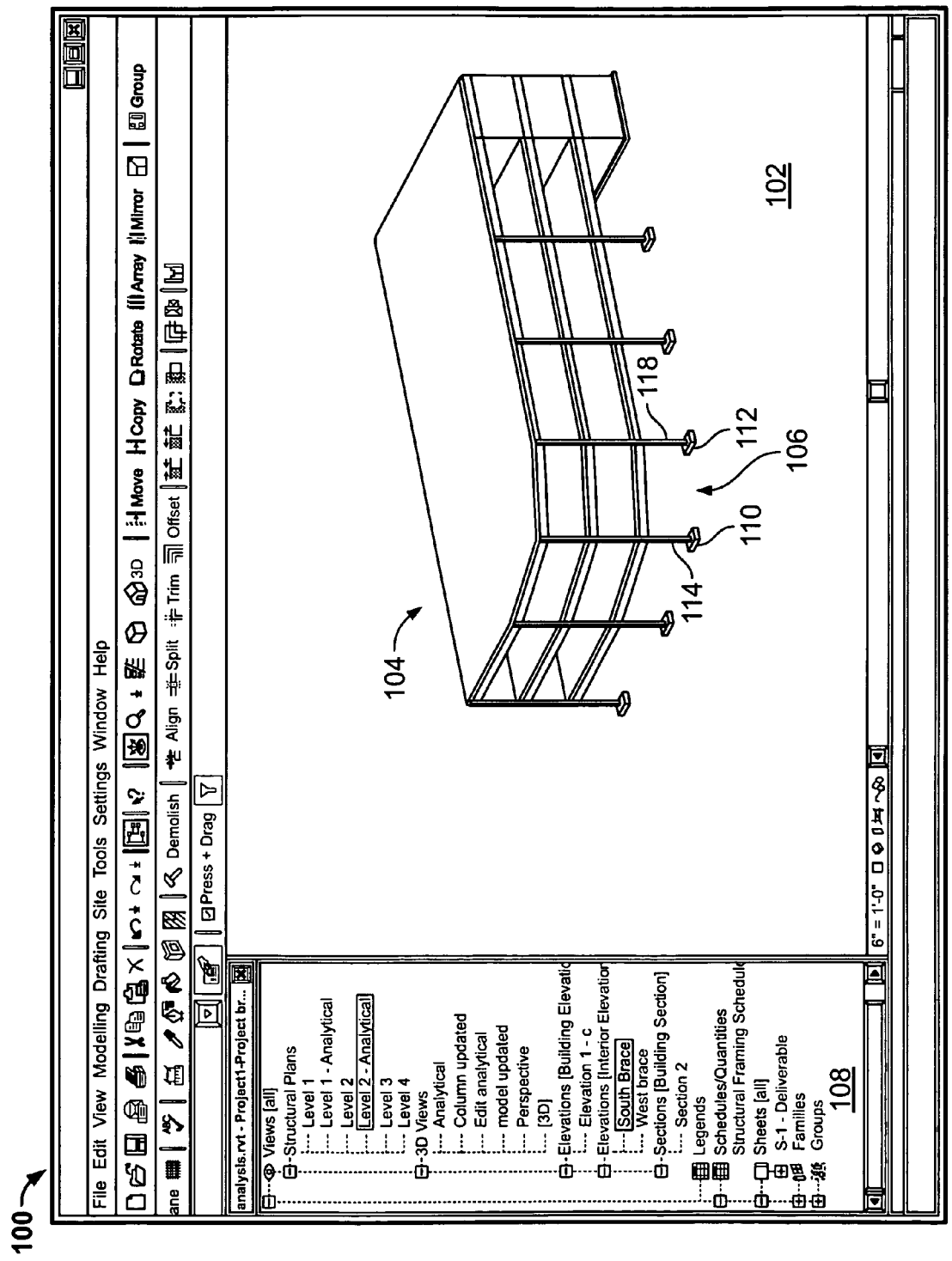
FIG. 1 shows a user interface for viewing and manipulating one or more computer aided design models.

FIG. 1 shows a user interface 100 for viewing and manipulating one or more CAD models. The user interface 100 can be presented by an interactive CAD software application that allows for the viewing, creating, importing, exporting, and modifying of one or more CAD models. In one implementation, the software application is Autodesk® Revit® Structure, available from Autodesk, Inc. of San Rafael, Calif. Generally speaking, a CAD model is one or more CAD models, or a view of one or more CAD models, or combinations of these. A CAD model can contain information required to represent one or more physical and analytical elements, and relationships between them, and results from structural analysis. For example, a CAD model can store one or more representations of a CAD model of a building. A CAD model can be stored in one or more files, object-oriented databases, relational databases, distributed objects, combinations of these, or other suitable persistent storage. The term "model" as used herein is synonymous with the CAD model's contents.

Although a graphical user interface (GUI) is illustrated, other user interfaces are possible, including user interfaces that allow for user interaction by means of sound, voice, gesture, eye movement, use of remote control devices, manually controlled devices, and combinations of these. The user interface can be provided on a number of computing devices including, but not limited to, devices such as a workstations, personal computers, cellular telephones, personal digital assistants, portable video playback devices, combinations of these, and other suitable devices. In one implementation, the user interface can be presented as one or more web pages. By way of illustration, the CAD tool can execute on one or more computing devices connected by one or more wired or wireless networks, shared memory, inter-processor networks, or other suitable means. A computing device can run a proprietary or commercially available multi-tasking operating system such as, without limitation, Microsoft Windows® XP (available from Microsoft Corp. of Redmond, Wash.), Linux (available from www.lixux.org), and Apple OS X (available from Apple Computer, Inc. of Cupertino, Calif.).

The user interface 100 illustrated in FIG. 1 can present one or more views of one or more models. A three dimensional (3D) view 102 presents a physical representation of a CAD model of a building. The view 102 can be used to create and modify the physical representation 104. The physical representation 104 depicts physical elements of the building represented by the CAD model including, without limitation, beams, braces, floors, slabs, columns, walls, and isolated and continuous footings. In one implementation and by way of illustration, the user interface 100 includes a view panel 108, which allows a user to select views and display one or multiple views in the user interface 100. The view panel 108 includes, but is not limited to, two dimensional (2D) and 3D views, plans, elevations, sectional views, analytical views, and combinations of these. View 102 shows a CAD model of a building section 106 having beams 114 and 118, and footings 110 and 112. Physical elements can be associated with attributes. In one implementation, physical element attributes include, without limitation, geometry, location, weight, cross sectional area, construction materials, reference to one or more corresponding analytical elements, and other suitable properties. Attribute values can be specified by the user or provided by default.

Figure 2:
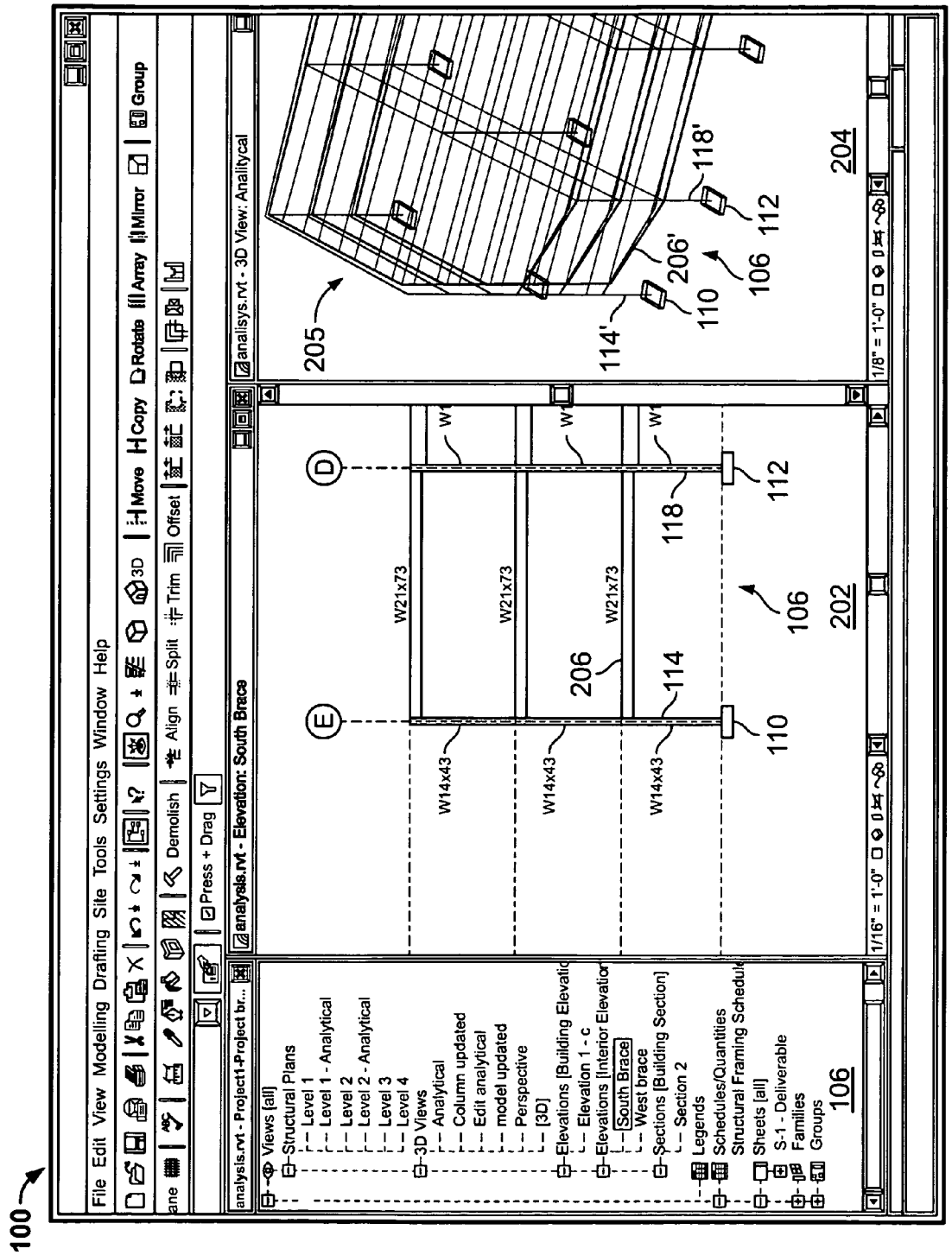
FIG. 2 shows a user interface displaying two views of a CAD model.

FIG. 2 illustrates additional views of the CAD model representing a building. A 3D view 204 showing an analytical representation 205 of section 106 is presented. The view 204 can be used to view and modify the analytical representation 205. The analytical representation 205 depicts analytical elements corresponding to the physical elements included in the physical representation 104. In one implementation, a given physical element may not have a corresponding analytical element. The analytical representation 205 can be generated automatically as the user creates or modifies physical elements. In one implementation, analytical elements are simplified versions of physical elements. For example, an analytical element can be a line or a planar surface. See Table 1. In a further implementation, an association between a given physical element in the physical representation 104 and one or more corresponding analytical elements in the analytical representation 205 can be established by including a reference to the one or more analytical elements in the physical element's attributes.

In one implementation, the analytical elements are automatically connected to one another to form a wire frame representation of the CAD model. In one implementation, a predetermined type of analytical element corresponds to a particular type or types of physical elements. Thus, when generating an analytical representation corresponding to the physical representation, analytical elements corresponding to physical elements can be created accordingly. An analytical element has a default position in relation to the analytical element's corresponding physical element(s). See Table 1. For example, a physical element representing a column has a corresponding analytical element that is a line that runs through the center of the column location.

TABLE 1

| PHYSICAL ELEMENT | ANALYTICAL ELEMENT | DEFAULT LOCATION OF ANALYTICAL ELEMENT |
| --- | --- | --- |
| Beam | Line | Parallel and centered on the top surface of the beam for floors and centered for trusses. |
| Brace | Line | Parallel through the center of the brace. |
| Column | Line | Parallel through the center of the column. |
| Wall | Planar Surface | Parallel through the center plane of the wall. |
| Floor/Slab | Planar Surface | Parallel on the top surface of floor/slab or in the mid plane of the floor/slab. |

As the analytical representation is generated in parallel with the physical representation, connections between physical elements cause connections to be made between analytical elements. In some instances, the location of an analytical element is deviated from the default location so that that the analytical element may connect to another analytical element. As a result, an analytical element may be partially coincident with, or incongruous to, a corresponding physical element. In one implementation, connections between analytical elements maintain coherence in the analytical representation. Coherence takes into account the probable location of finite element analysis nodes on analytical elements (e.g., for structural analysis) and guides connections between analytical elements to these locations. A node is a point at which different elements are joined together and where values of unknowns can be approximated. By way of illustration, if the analytical representation of a physical element representing a beam is attached at one end to the surface of a physical element representing a column, the corresponding analytical element representing the beam (which is a line centered on the top surface of the physical element representing the beam) will pass through the physical element representing the column to connect with the analytical element representing the column (which is a line located at the center of the column).

Default analytical element locations and coherence requirements can be described by rules or information which can be created and modified by the user or structural analysis. In one implementation, coherence of the analytical representation is not a prerequisite to performing structural analysis of the CAD model. In one implementation, the default location and connectivity of an analytical element can be overridden by the user.

The analytical representation can include, without limitation, the following attributes: geometry and location of analytical elements, moments of inertia, sheer capacity, connectivity or end conditions (e.g., pinned, fixed, free), material properties, reference to one or more corresponding physical elements, and release conditions. Attribute values can be specified by a user or provided by default. In one implementation, default attribute values can be determined based on heuristics informed by, for example and without limitation, the user's past interaction with the CAD model, the materials and geometries of the physical elements, building codes, historical weather patterns for a given location, and the purpose of the structure (e.g., office, hospital, school, condominium, parking garage, etc.).

When an attribute of an analytical element is modified, the corresponding physical element can be adjusted to reflect the modification. In one implementation, when an analytical element attribute is changed, analytical elements that are connected to the analytical element are adjusted, if necessary to maintain coherency. For instance, if the user moved the location of an analytical element representing a horizontal beam, then analytical elements connected to the moved analytical element would be moved or resized accordingly, in order to maintain their coherent connection to the beam. In one implementation, changing the location or size of an analytical element does not change the location of the analytical element's corresponding physical element.

Referring again to FIG. 2, the analytical view 204 includes analytical elements representing columns (114', 118') and a beam 206' connecting the columns (114', 118'). A 2D elevation view 202 of the physical representation of the section 106 shows the corresponding physical elements 114, 118 and 206. Changes made to physical element attributes can be automatically reflected in corresponding analytical elements, and vice versa. In one implementation, changing the location of an analytical element does not cause the corresponding physical element to change its location. This allows a user to manipulate the analytical representation to capture eccentricities such as a torque or turning not manifest in the physical representation.

In one implementation, structural analysis optimization of the CAD model (or portions thereof) can be performed by or from the CAD software application. Structural analysis include applying simulated loads (which can be generated in the CAD software application) to the analytical representation and, based on the results, suggesting design changes or redesigning the corresponding physical elements, for example, that reach their maximum stresses. In one implementation, a commercially available structural analysis program is used to perform the analysis. The structural analysis program can be tightly integrated with the CAD software application (e.g., as a plug-in module or dynamic link library) or loosely integrated (e.g., requiring export of the CAD model to the structural analysis program). As examples, the following commercially available structural analysis programs can be used: ETABS, available from Computers and Structures, Inc. of Berkeley, Calif.; RISA-3D, available from RISA Technologies of Foothill Ranch, Calif.; or ROBOT Millennium available from RoboBAT/ISS Inc. Other types of analysis programs can be integrated with the CAD software application including, but not limited to, concrete design analysis, lateral load analysis, gravity load analysis, beam design analysis, steel design analysis, dynamic analysis, seismic analysis and steel connection design analysis.

In yet a further implementation, changes made to the CAD model by structural analysis program or by a user interacting with the structural analysis or other analysis program are saved. For example, the structural analysis program might change the thickness and position of columns in the physical representation. These changes are saved in the CAD model and thus are available to be viewed and modified from the CAD tool. This integrated model capability can eliminate redundant work done by physical engineers in modeling and analyzing buildings and improve the coordination with the physical drafters that finish the drawings.

Figure 3:
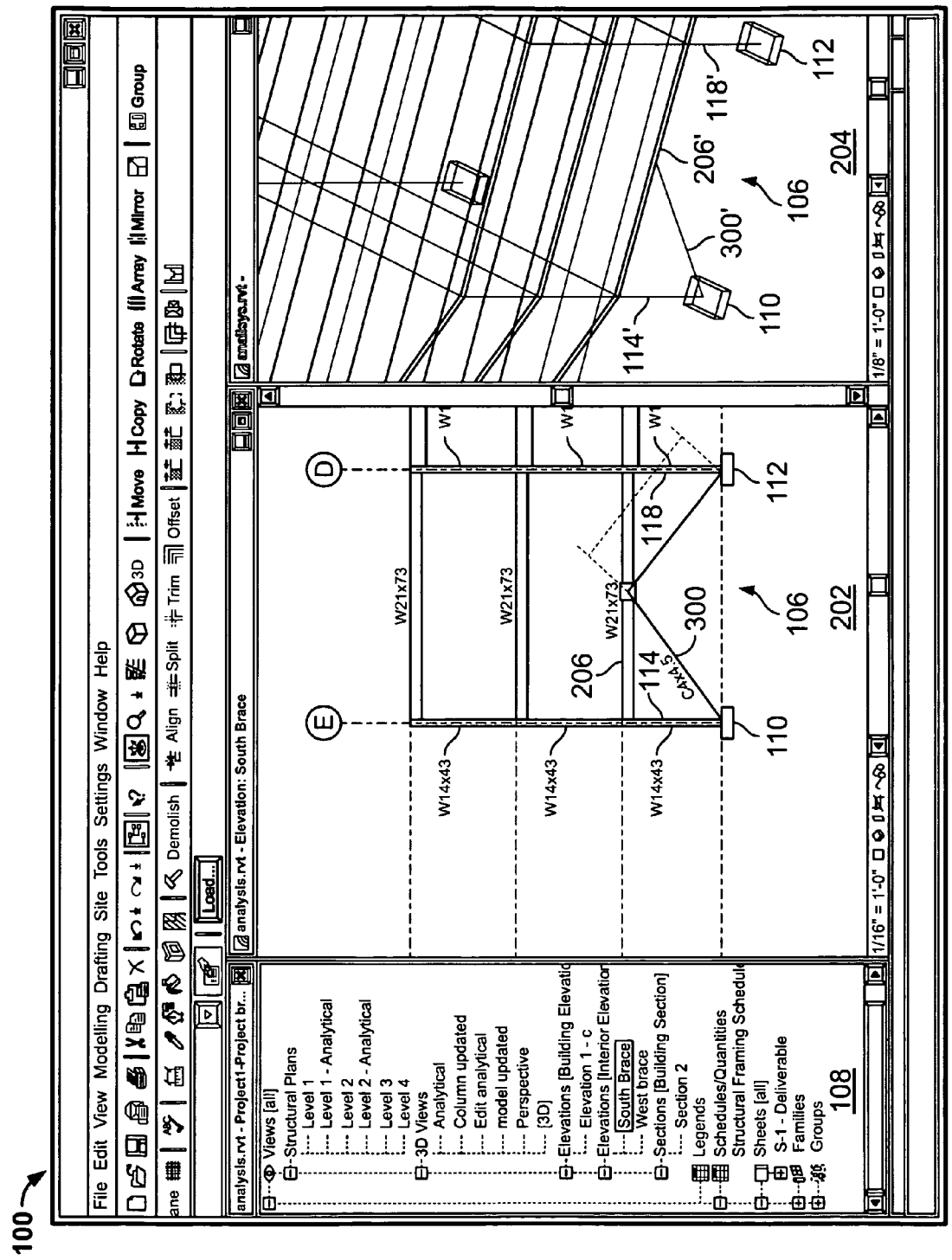
FIG. 3 shows a user interface displaying two views of a CAD model.
Figure 4:
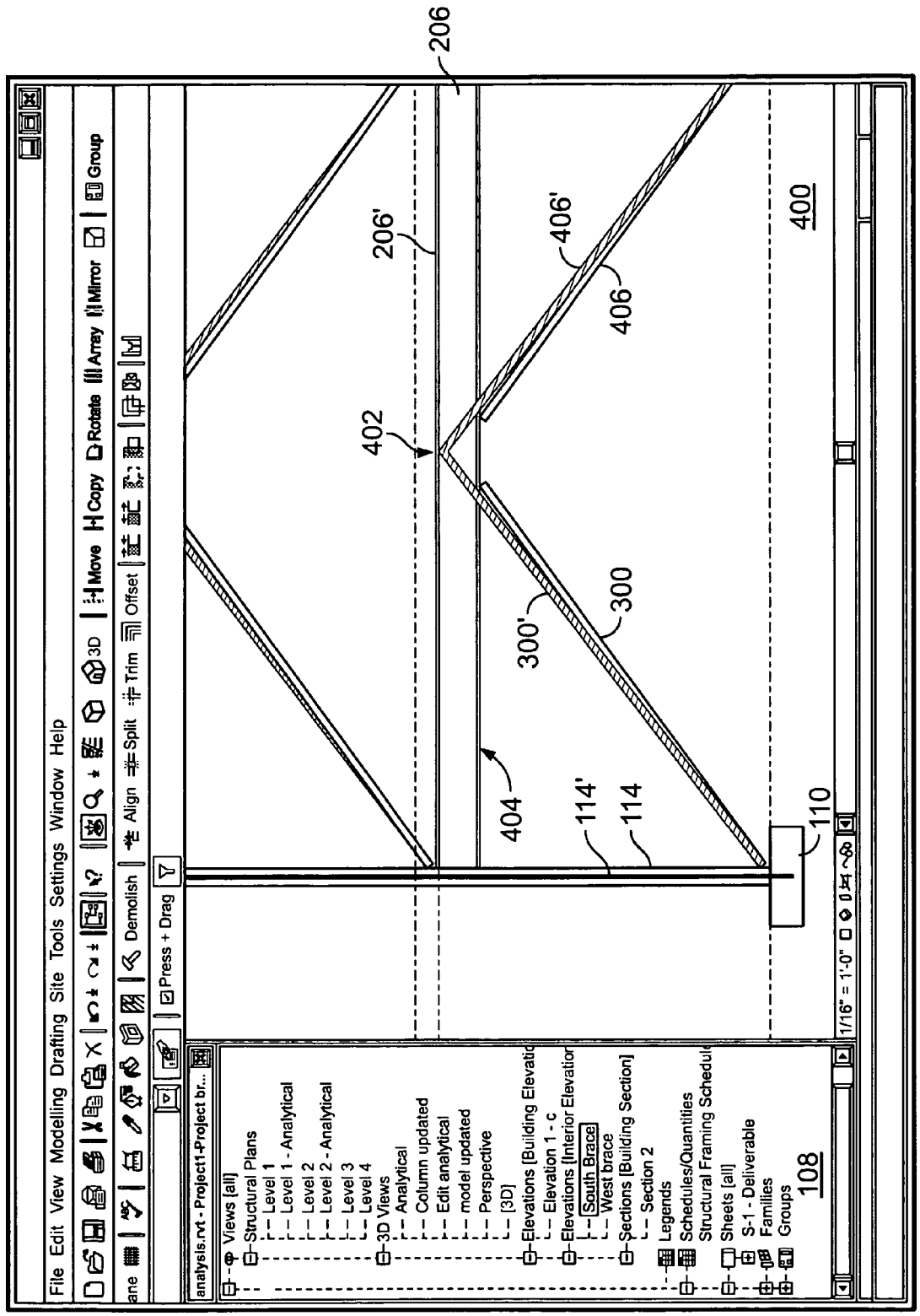
FIG. 4 shows a user interface displaying an elevation view combining physical and analytical representations.

FIG. 3 shows the section 106 shown in FIG. 2 after a physical element 300 representing a support brace has been added. In this illustration, addition of the physical element 300 (as shown in view 202) automatically causes the generation of a corresponding analytical element 300' shown in view 204. The analytical representation is automatically maintained as the user creates, modifies, or deletes physical elements. For example, if the user moves or deletes the physical element 300, the counterpart element 300' is automatically moved or deleted. In one implementation and by way of further illustration, if the user moves or deletes the analytical element 300', the counterpart physical element 300 is not moved or deleted. As illustrated in FIG. 4, the default location of the analytical element 300' is not required to be entirely coincident with the physical element 300, in order to achieve coherence in the analytical representation.

FIG. 4 shows an elevation view 400 that combines physical and analytical representations. In this illustration, a physical element 406 representing a brace 406 has been added to section 106. Each physical element (206, 300, 406, 114) has a corresponding analytical element (206', 300', 406', 114') that was automatically generated. Notice that the analytical element 114' representing a column is parallel to and coincident with the center of the physical element 114 representing the column. The analytical element 206' representing the beam is coincident with the top surface of the physical beam 206. In one implementation, analytical elements representing physical beams, floors and slabs are coincident with the top surfaces of the corresponding physical elements based on the assumption that top surfaces are where finite element analysis nodes are located for structural analysis purposes. Notice however that the analytical elements 300' and 406' representing braces are not coincident with the top surfaces of the corresponding physical elements 300 and 406. In one implementation, coherence requires the analytical elements connect with the analytical element 206' representing the beam at the center point 402 of the analytical element 206' representing the beam. This would not be the case if the analytical elements 300' and 406' representing the cross beams were entirely coincident with their corresponding physical elements. In one implementation the user can manipulate the analytical representation and defeat coherence.

Figure 5:
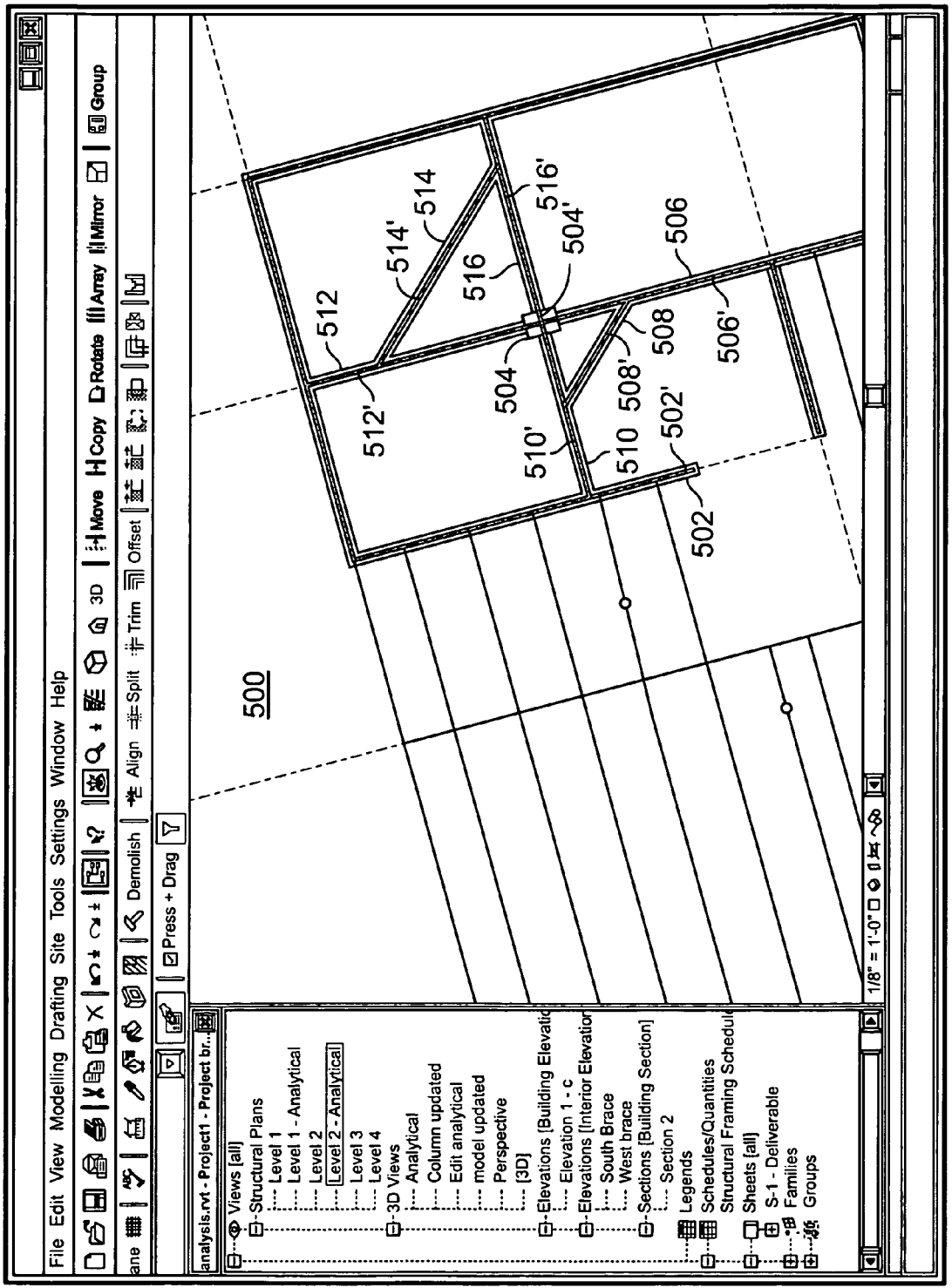
FIG. 5 shows a user interface displaying a plan view combining physical and analytical representations.

FIG. 5 shows a plan view 500 that combines physical and analytical representations. The physical element 504 representing a column has a corresponding analytical element 504', which is represented by the center point of the element 504 representing the column. In an elevation view of the element 504 representing the column, the analytical element 504' representing the column would appear as a vertical line running through the center of the column. Physical elements 506, 510, 512 and 516 representing beams all abut the physical element 504 representing the column. However, the analytical elements 506', 510', 512' and 516' representing the beams extend into the physical element 504 representing the column to connect with the analytical element 504' representing the column in order to create a coherent representation. The element 508 is a secondary beam supported by the two primary beams 510 and 506. The analytical element 508' representing the secondary beam lies on the top surface of the physical element 508 representing the secondary beam and connects to analytical elements 510' and 506' representing the primary beams at either end. Likewise, element 514 representing the secondary beam supported by the two primary beams 512 and 516. The analytical element 514' representing the secondary beam lies on the top surface of the physical element 514 and connects to analytical elements 512' and 516' representing the primary beams at either end. The physical element 510 representing a beam abuts physical element 502 representing a wall. The analytical element 510' representing the beam connects to the analytical element '502 representing the wall plane which lies in the center of the element 502 representing the wall.

Figure 6:
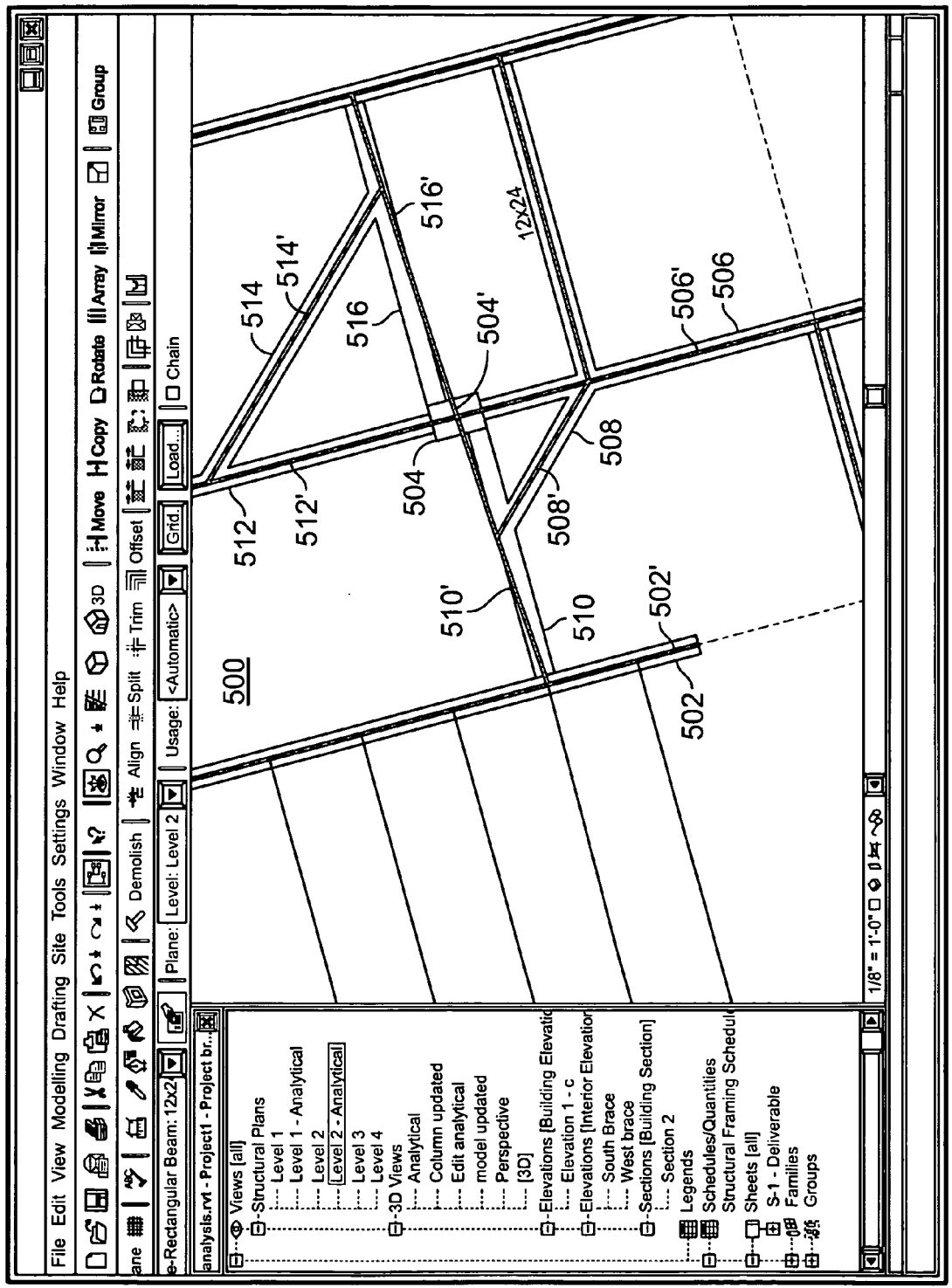

FIG. 6 illustrates divergence of an analytical representation from a physical representation. As presented in view 500, physical elements 516 and 510 representing the beams have been moved to place them off center from physical element 504 representing the column. Notice, however, that the corresponding analytical elements 510' and 516' have by default remained connected to the analytical element 504' representing the column even though the analytical elements 510' and 516' are no longer coincident with their corresponding physical elements 510 and 516 representing the beams. This is to preserve the coherence of the analytical representation. However, as discussed above, the user can override the default configuration of the analytical representation.

Figure 7:
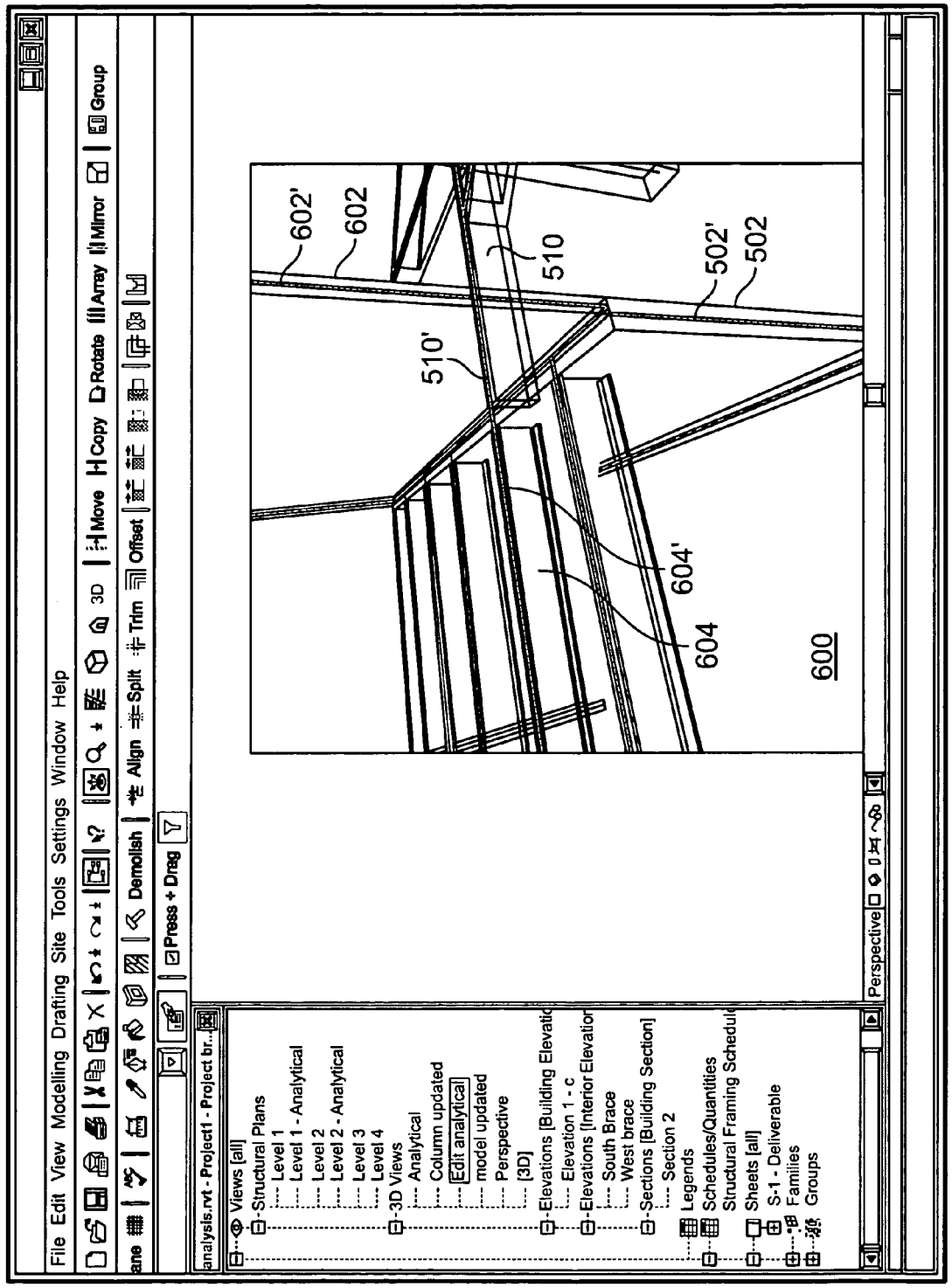
FIG. 7 shows a user interface displaying 3D view combining physical and analytical representations of a CAD model.
Figure 8:
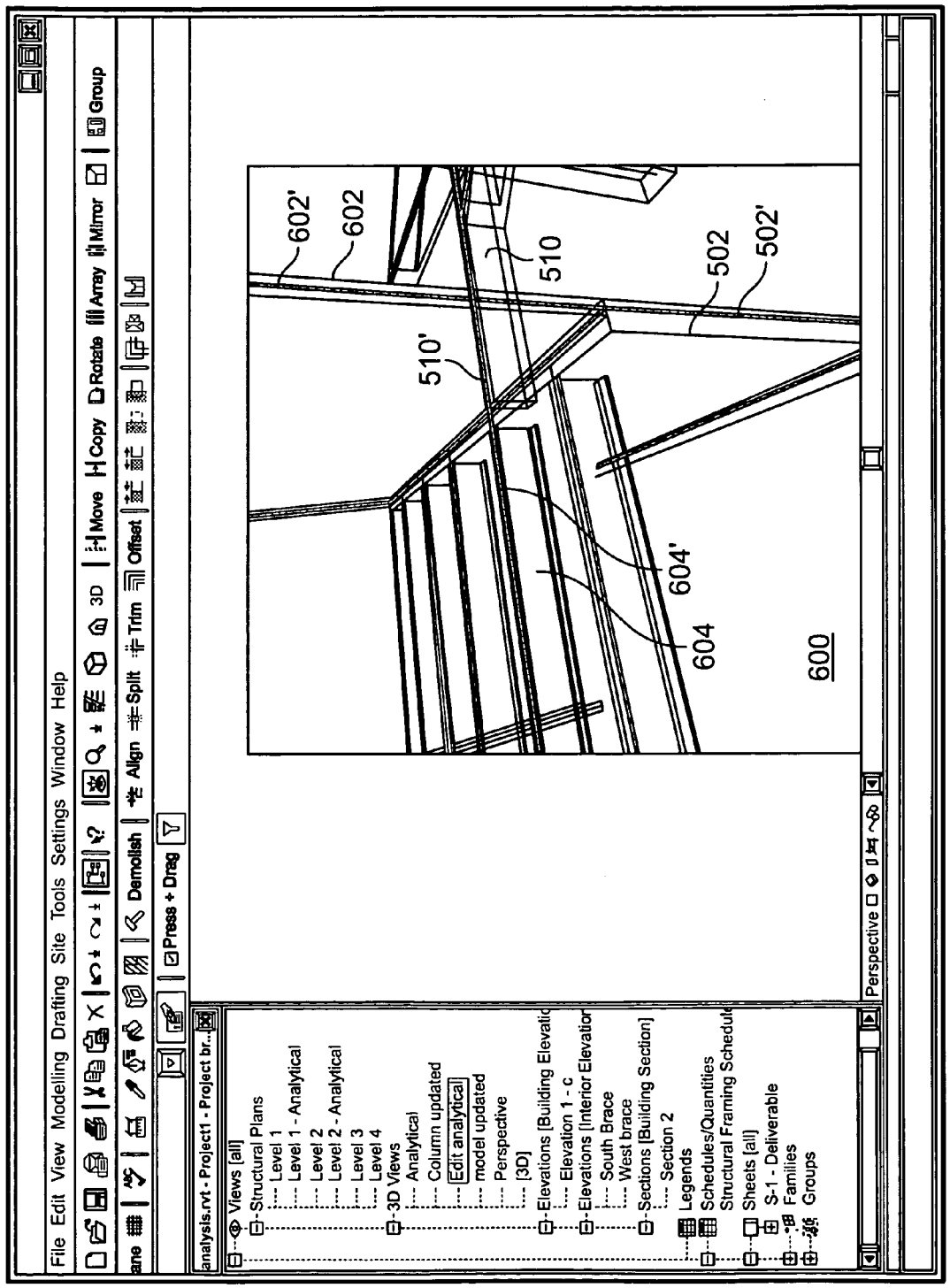
FIG. 8 shows a user interface displaying 3D view combining physical and analytical representations of a CAD model.

FIG. 7 shows a 3D view that combines physical and analytical representations of two walls. Physical element 510 representing a beam abuts physical element 502 representing a lower wall while the corresponding analytical element 510' representing the beam connects to the analytical element 604' corresponding to a physical element 604 representing the beam on the other side of the physical element 502 representing the wall. Physical element 602 representing an upper wall is supported by physical element 502 representing the lower wall. Although the surfaces of the elements 502 and 602 representing the walls lie in the same plane on one side, the surfaces on the other side do not since the element 502 representing the lower wall is thicker than the element 602 representing the upper wall. The analytical model for walls 502 and 602 is a surface and the default location is the center plane of the wall. The analytical elements for the element 602 representing the upper wall and the element 502 representing the lower wall do not lie in the same plane. From a structural analysis standpoint, this means that the upper wall is not supported by the lower wall. In one implementation, one of the upper 602' or lower 502' analytical wall elements is automatically moved to be in line with the other. In other implementation, the user can manually move one or both of the analytical elements 602' and 502' so they lie in the same plane. The decision is based on engineering judgment. View 600 in FIG. 8 shows the analytical wall elements 602' and 502' in alignment as a result of moving the analytical wall element 502'. Notice how the physical wall elements 502 did not change location.

Figure 9:
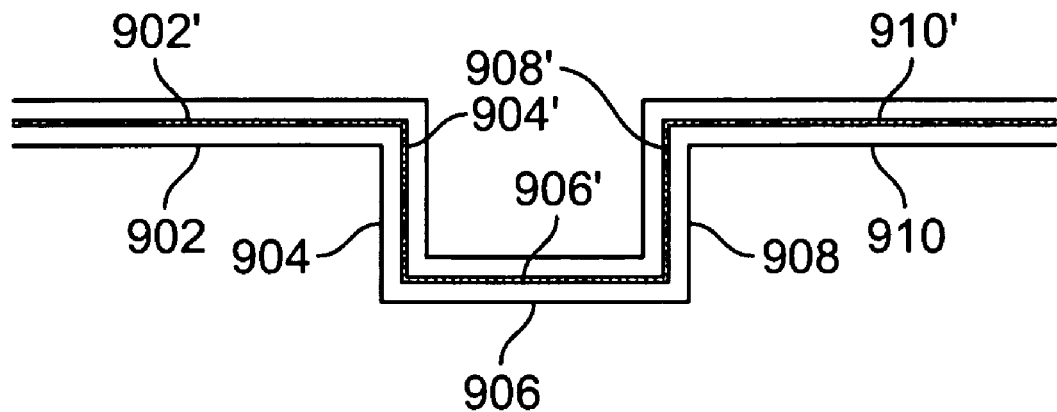
FIG. 9 is a schematic representation illustrating an override as a default analytical representation.
Figure 9:
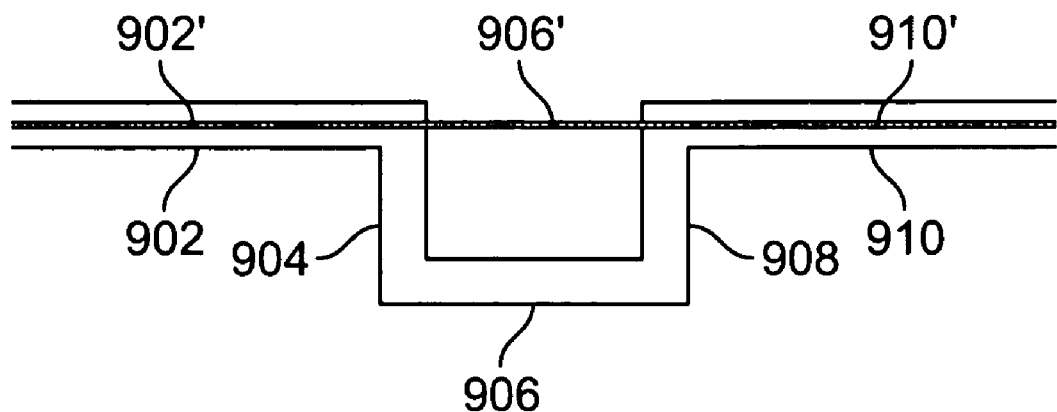

FIG. 9 presents another example of overriding the default analytical representation. In part (a) of FIG. 9, a wall consisting of five physical wall elements (902, 904, 906, 908, 910) is shown along with the wall's corresponding default analytical representation consisting of analytical wall elements (902', 904', 906', 908', 910'). In part (b) of FIG. 9, a user has decided not to have an analytical model for wall elements 904' and 908', and projected analytical wall element '906 to be in alignment with elements '902 and '910.

Figure 10:
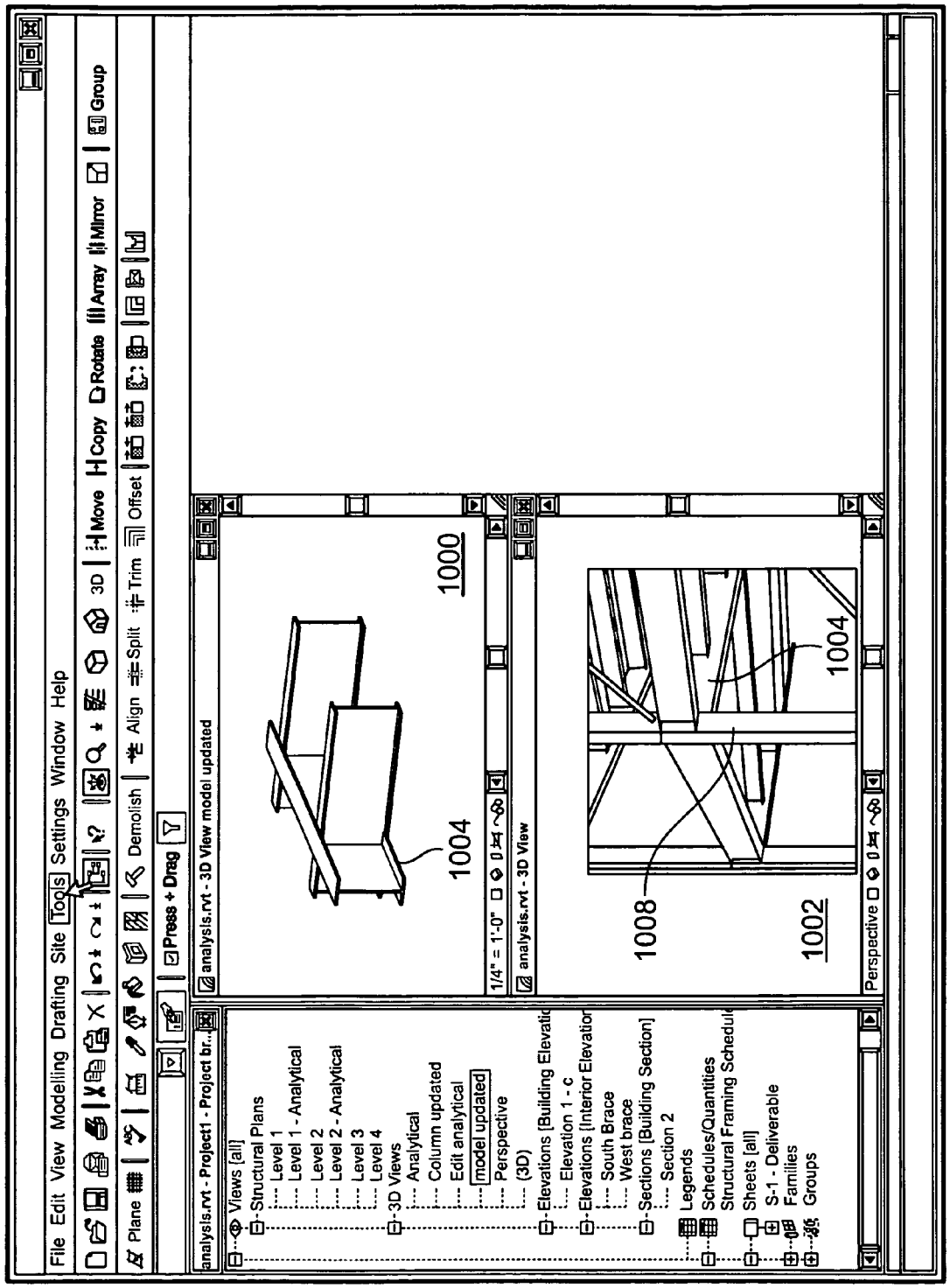
FIG. 10 shows a user interface illustrating several views of a CAD model before performing a structural analysis.
Figure 11:
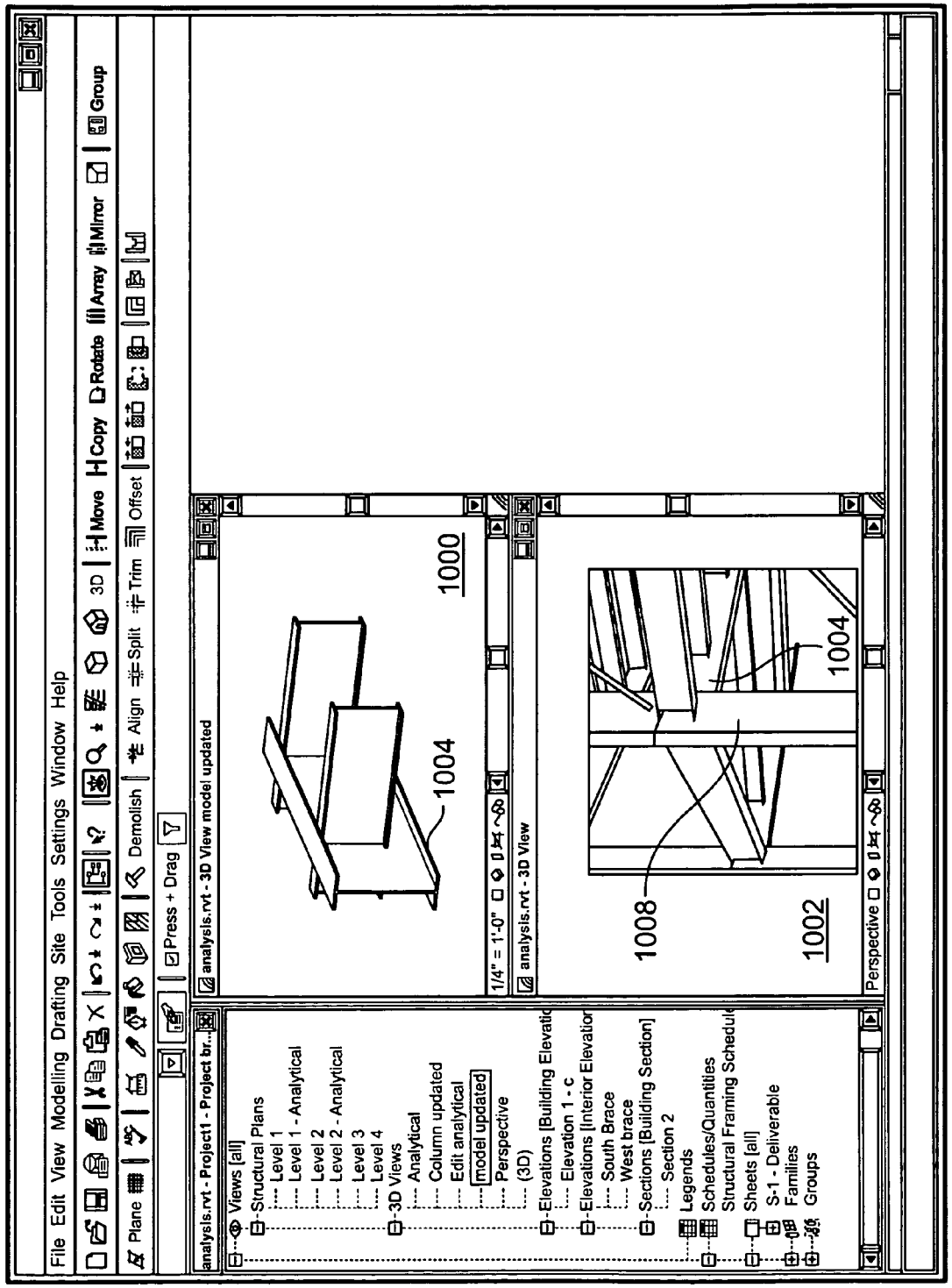
FIG. 11 shows a user interface illustrating several views of the CAD model after performing the structural analysis.

FIG. 10 illustrates several views of a CAD model before performing structural analysis. View 1002 is a 3D view of the physical representation 1004 of a CAD model representing a building showing column 1008 and beam 1004. View 1000 is a close up view of beam 1004. A structural analysis of the physical representation 104 of a CAD model representing a building determined that beam 1004 and column 1008 needed to be strengthened in order to avoid reaching their maximum stress capacity. The structural analysis program can perform this adjustment by modifying the sizes of the beam and column in the CAD model. After structural analysis, as shown in FIG. 11, beam 1004 and column 1008 are widened.

Figure 12:
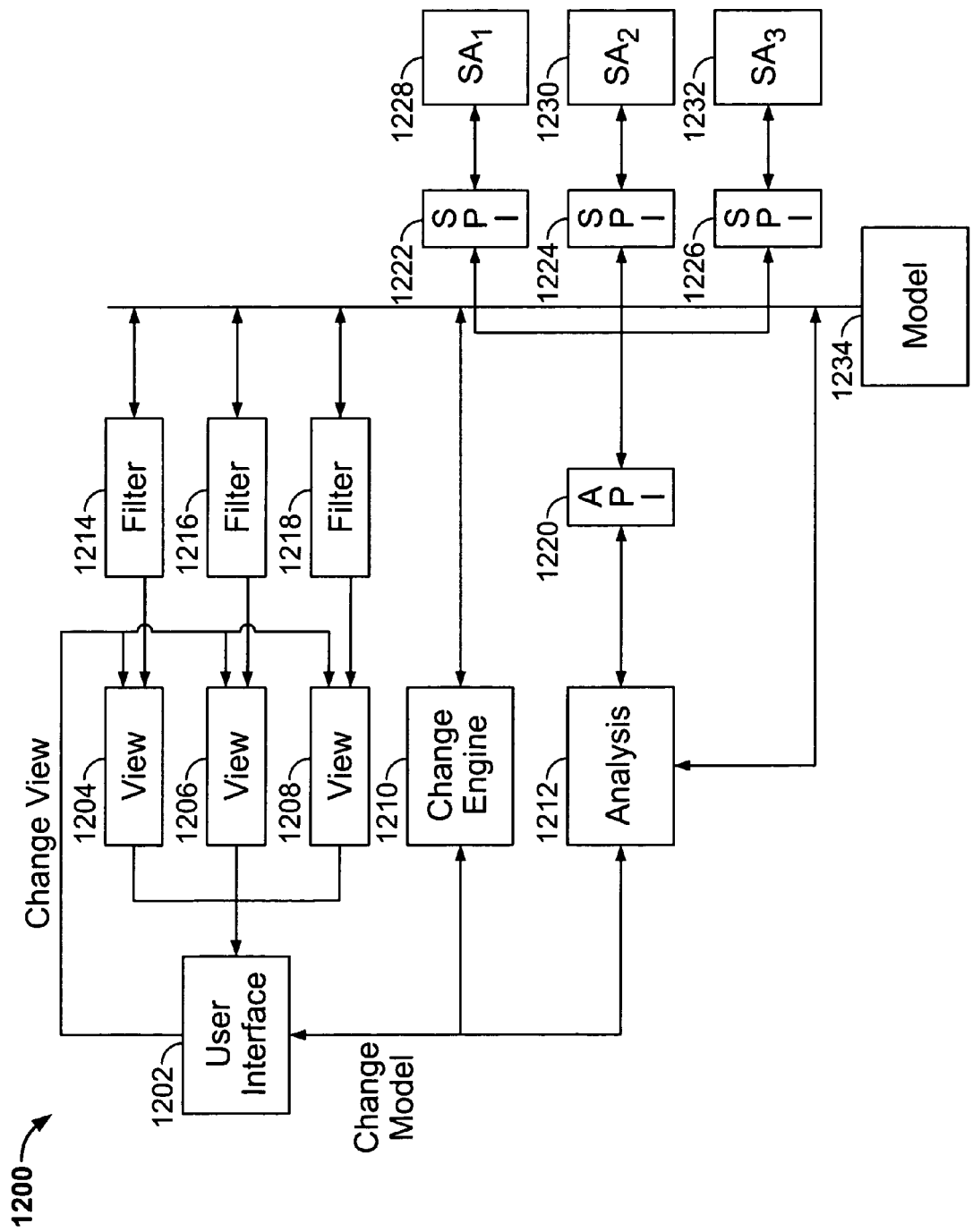
FIG. 12 is a schematic representation of a system for synchronizing physical and analytical representations of a CAD model.

FIG. 12 is a system 1200 for synchronizing physical and analytical representations of a CAD model 1234. A user interface 1202 provides one or more views (1204, 1206, 1208) of the CAD model 1234. Generally speaking, a view (1204, 1206, 1208) can present n-dimensions (e.g., 2D, 3D) of information pertaining to the CAD model 1234. Views can, for example, be scaled, rotated and translated. A view can optionally present an altered version of the CAD model by applying one or more filters (1214, 1216, 1218) to the CAD model. A filter can screen out certain types of information that are of no interest to a given view. For example, a physical view can use a filter to screen out analytical representations of physical elements, whereas a purely analytical view can use a filter to screen out physical elements. Alternatively, a filter can interact with elements in the CAD model in order to obtain specific representations of the element. For example, an element could render itself as a solid, physical object, as an analytical representation of the physical object, or both.

In one implementation, the user interface 1202 propagates information pertaining to changes the user makes to the CAD model 1234 through one or more views (1204, 1206, 1208) to a change engine 1210. The change engine 1210 accepts this information and uses it to maintain synchronization between the analytical representation and the physical representation of the CAD model. For example, if a user moves a physical element, the change engine moves the corresponding analytical element(s) (as necessary) to maintain coherence in the analytical representation. Likewise, changes to attributes made in one representation are reflected in the other by the change engine 1210. The change engine 1210 generates the analytical representation as the user interactively generates or edits the physical representation.

In one implementation, structural analysis of the analytical representation is initiated by the analysis component 1212. In one implementation, the analysis component 1212 invokes one or more structural analysis programs (1228, 1230, 1232) (or other types of analysis programs, e.g., concrete design analysis, lateral load analysis, gravity load analysis, beam design analysis, steel design analysis, dynamic analysis, seismic analysis and steel connection design analysis) through an application programming interface (API) 1220. The API 1220 communicates with an analysis program through a service provider interface (SPI), such as 1222, 1224 and 1226. Each analysis program (1228, 1230, 1232) implements the SPI. The API 1220 and the SPIs (1222, 1224, 1226) can implement a communication protocol that exchanges information using memory buffers, shared memory, dynamically linked libraries, network communication mechanisms, or other suitable means including more than one of these.

In one implementation, an API and an SPI are instantiations of objects. An API object's methods invoke an SPI object's methods in order to transfer model information and perform structural analysis. For example, a structural analysis program (1228, 1230, 1232) may need to export the CAD model 1234 or otherwise convert the CAD model 1234 into a format suitable for structural analysis. In a further implementation, the API 1220 can cause a structural analysis program (1228, 1230, 1232) to present a GUI through which the user can direct the analysis. In another implementation, the structural analysis programs (1228, 1230, 1242) can directly read and write information to the CAD model 1234 (e.g., through an SPI or other suitable means).

The structural analysis program, or the user of the structural analysis program, can change attributes of both physical and analytical elements in the CAD model 1234. For example, the size of elements can be increased to accommodate loads. In one implementation, physical and analytical element attributes can be recognized by the structural analysis programs (1228, 1230, 1232). Analysis results can also be stored with each element's attributes. These changes to element attributes are automatically incorporated into the CAD model 1234 directly or indirectly (e.g., by importing information from an analysis program) thereby making the changes immediately available for viewing in the user interface 1202.

The system 1200 may have fewer or more components than those illustrated in FIG. 12. A given component can execute on one or more communicably coupled computing devices. For instance, computing devices can be connected by a wired network, a wireless network, the Internet, shared memory, an inter-processor communication channel, or combinations of these.

Figure 13:
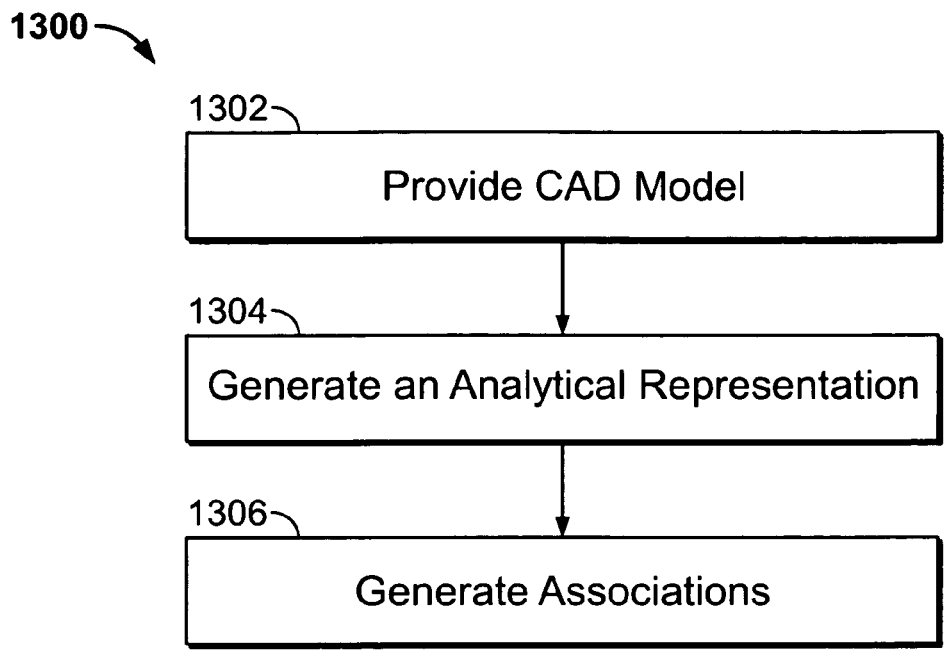
FIG. 13 is a flow diagram showing a process for creating model associations.

FIG. 13 is a flow diagram 1300 illustrating creation of model associations. A CAD model 1234 is provided by receiving user input creating the CAD model 1234 from the user interface 1202 or importing the CAD model (step 1302). An analytical representation of a physical element in the CAD model 1234 is generated (step 1304 e.g., by the change engine 1210). The analytical representation can be generated as the user generates the physical representation or when the CAD model 1234 is imported. Associations are established between physical elements in the physical representation and analytical elements in the analytical representation (step 1306 e.g., by the change engine 1210). Associations can be established as physical elements are added to the CAD model or when the CAD model is imported.

Figure 14:
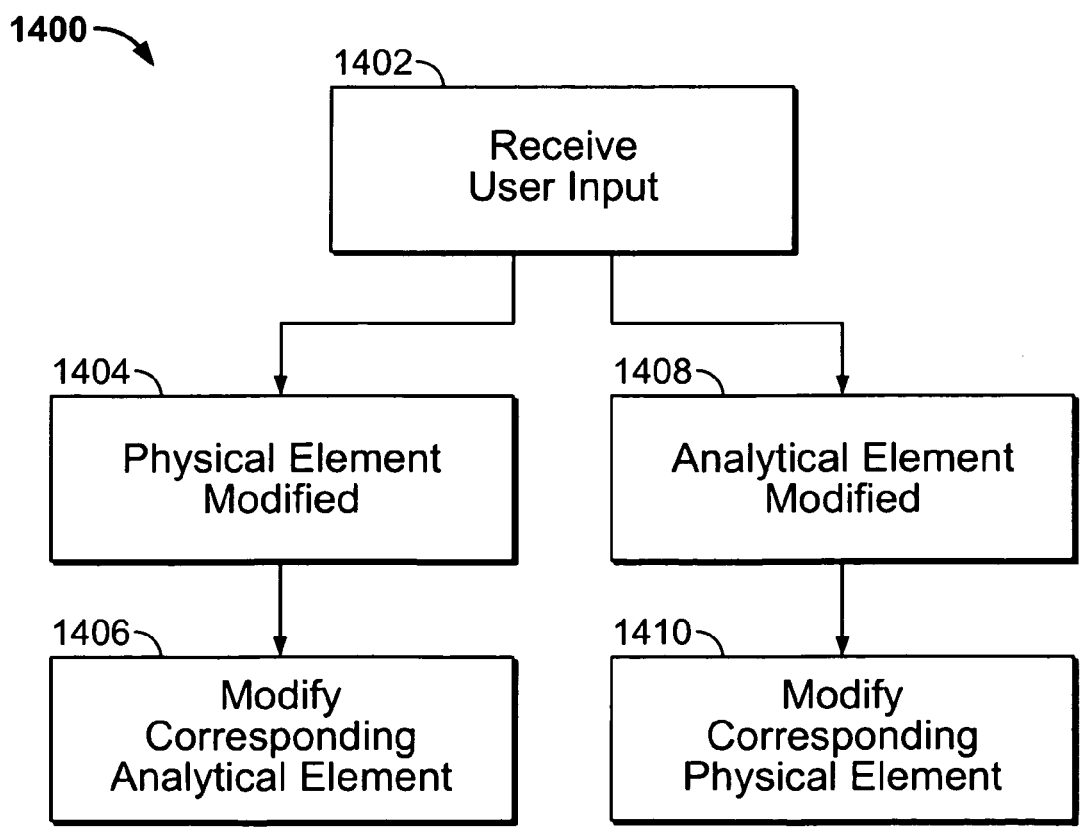
FIG. 14 is a flow diagram showing a process for user modification of a CAD model.

FIG. 14 is a flow diagram 1400 illustrating user modification of a CAD model 1234. User input is received from the user interface 1202, where the user input represents a modification to a physical element in the physical representation or a modification to an analytical element in an analytical representation (step 1402). If the modification is to a physical element (step 1404), one or more corresponding analytical elements are modified accordingly to reflect the modification to the physical element (step 1406 e.g., by the change engine 1210). If the modification is to an analytical element (step 1406), one or more corresponding physical elements are modified accordingly to reflect the modification to the analytical element (step 1410 e.g., by the change engine 1210).

Figure 15:
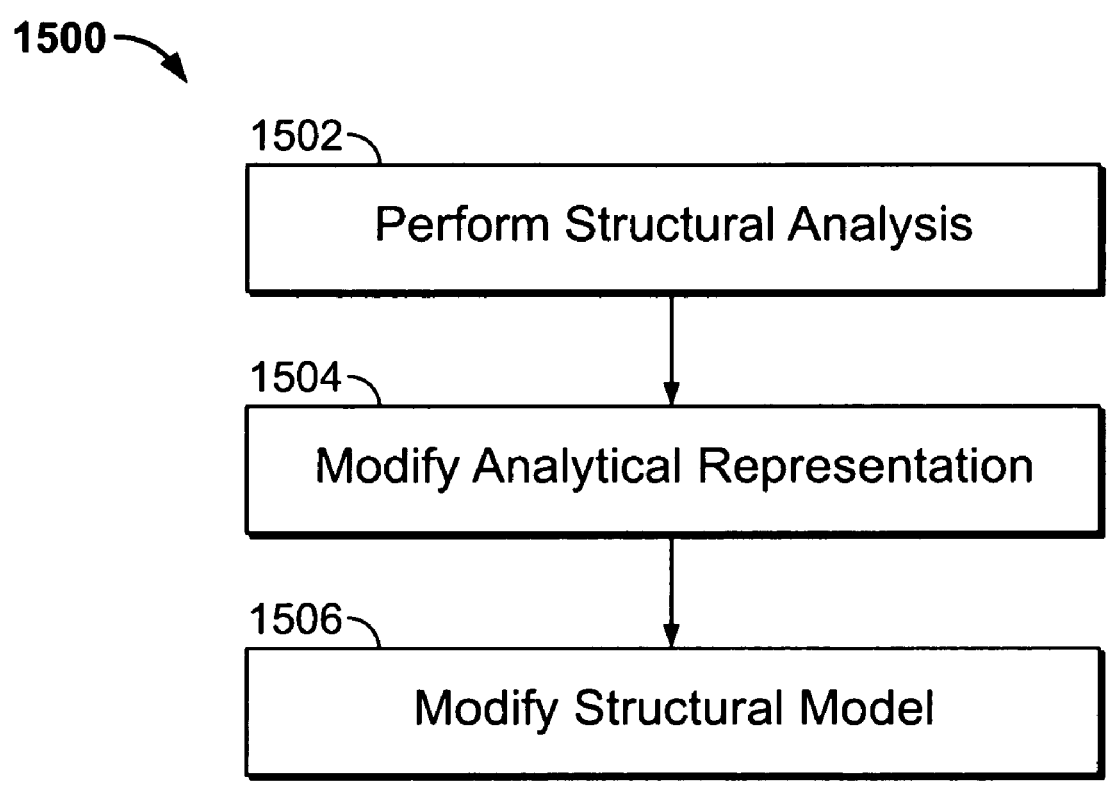
FIG. 15 is a flow diagram showing a process for synchronizing an analytical representation and a physical representation of a CAD model.

FIG. 15 is a flow diagram 1500 illustrating propagation of changes between an analytical representation and a physical representation. Structural analysis of a CAD model is performed (step 1502 by, or initiated by, e.g., the analysis component 1212). Based on the results of the analysis, analytical elements in the analytical model are modified (step 1504). For example, the structural analysis can change properties of analytical elements in order to optimize the corresponding structure under test conditions. The corresponding physical elements in the physical representation are modified to reflect the modification to the analytical elements (step 1506).

The invention and all of the functional operations described in this specification can be implemented in digital electronic circuitry, or in computer software, firmware, or hardware, including the structural means disclosed in this specification and structural equivalents thereof, or in combinations of them. The invention can be implemented as one or more computer program products, i.e., one or more computer programs tangibly embodied in an information carrier, e.g., in a machine readable storage device, medium, or in a propagated signal, for execution by, or to control the operation of, data processing apparatus, e.g., a programmable processor, a computer, or multiple computers.

A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; a magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

To provide for interaction with a user, the invention can be implemented on a computer system having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

Certain features which, for clarity, are described in this specification in the context of separate implementations, may also be provided in combination in a single implementation. Conversely, various features which, for brevity, are described in the context of a single implementation, may also be provided in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

A number of implementation of the invention have been described. Nevertheless, it will be understood that various modifications may be made without departing from the spirit and scope of the invention. For example, the steps of the invention can be performed in a different order and still achieve desirable results. Accordingly, other implementations are within the scope of the following claims.

What is claimed is:

1. A computer-implemented method, comprising:
   providing a computer aided design (CAD) model comprising a plurality of physical elements;
   generating an analytical representation of the plurality of physical elements, the analytical representation comprising a plurality of analytical elements corresponding to the physical elements;
   generating an association between each analytical element and corresponding physical element such that a modification to one element can be applied to modify a corresponding other; and
   displaying a graphical view of the analytical representation and a graphical view of the physical elements on a display device.

2. The method of claim 1, further comprising:
   performing a structural analysis of the CAD model based on the analytical representation.

3. The method of claim 2, further comprising:
   modifying the analytical representation based on the structural analysis.

4. The method of claim 3, further comprising:
   modifying one or more of the plurality of physical elements based on the modification to the analytical representation.

5. The method of claim 1, where providing a CAD model comprises receiving user input creating the CAD model.

6. The method of claim 1, where providing a CAD model comprises importing an existing CAD model.

7. The method of claim 1, further comprising:
   receiving a user input modifying a physical element;
   modifying the physical element in accordance with the user input; and
   modifying a corresponding analytical element based on the modification to the physical element.

8. The method of claim 1, further comprising:
   receiving a user input modifying an analytical element;
   modifying the analytical element in accordance with the user input; and
   modifying a corresponding physical element based on the modification to the analytical element.

9. The method of claim 1, where:
   a physical element has an associated physical appearance.

10. The method of claim 1, where:
    an analytical element is a point-to-point wire frame representation of a corresponding physical element.

11. The method of claim 1, where:
    one or more of the analytical elements include a variation from the corresponding one or more physical elements, where the variation facilitates a structural analysis of the analytical representation.

12. A computer program product, encoded on an information carrier, comprising instructions operable to cause data processing apparatus to perform operations comprising:
    providing a computer aided design (CAD) model comprising a plurality of physical elements;
    generating an analytical representation of the plurality of physical elements, the analytical representation comprising a plurality of analytical elements corresponding to the physical elements;
    generating an association between each analytical element and corresponding physical element such that a modification to one element can be applied to modify a corresponding other; and
    displaying a graphical view of the analytical representation and a graphical view of the physical elements on a display device.

13. The product of claim 12, the operations further comprising:
    performing a structural analysis of the CAD model based on the analytical representation.

14. The product of claim 13, the operations further comprising:
modifying the analytical representation based on the structural analysis.

15. The product of claim 12, the operations further comprising:
modifying one or more of the plurality of physical elements based on the modification to the analytical representation.

16. The product of claim 12, where providing a CAD model comprises receiving user input creating the CAD model.

17. The product of claim 12, where providing a CAD model comprises importing an existing CAD model.

18. The product of claim 12, further comprising:
receiving a user input modifying a physical element;
modifying the physical element in accordance with the user input; and
modifying a corresponding analytical element based on the modification to the physical element.

19. The product of claim 12, the operations further comprising:
receiving a user input modifying an analytical element;
modifying the analytical element in accordance with the user input; and
modifying a corresponding physical element based on the modification to the analytical element.

20. A system, comprising one or more computers configured to perform operations including:
providing a computer aided design (CAD) model comprising a plurality of physical elements;
generating an analytical representation of the plurality of physical elements, the analytical representation comprising a plurality of analytical elements corresponding to the physical elements;
generating an association between each analytical element and corresponding physical element such that a modification to one element can be applied to modify a corresponding other; and
displaying a graphical view of the analytical representation and a graphical view of the physical elements on a display device.

* * * * *

UNITED STATES PATENT AND TRADEMARK OFFICE
CERTIFICATE OF CORRECTION

PATENT NO. : 7,761,266 B2
APPLICATION NO. : 11/340082
DATED : July 20, 2010
INVENTOR(S) : Nicolas Mangon It is certified that error appears in the above-identified patent and that said Letters Patent is hereby corrected as shown below:

In claim 15, column 13, line 6, delete "12," and insert -- 14, --, therefore.

Signed and Sealed this

Second Day of November, 2010

David J. Kappos
*Director of the United States Patent and Trademark Office*